United States Patent
Zhao et al.

(10) Patent No.: US 11,629,048 B2
(45) Date of Patent: Apr. 18, 2023

(54) METHOD OF FABRICATING A MICRO MACHINED CHANNEL

(71) Applicants: BERKIN B.V., Ruurlo (NL); UNIVERSITEIT TWENTE, Enschede (NL); STICHTING VOOR DE TECHNISCHE WETENSCHAPPEN, Utrecht (NL)

(72) Inventors: Yiyuan Zhao, Ruurlo (NL); Henk-Willem Veltkamp, Ruurlo (NL); Yaxiang Zeng, Ruurlo (NL); Joost Conrad Lötters, Ruurlo (NL); Remco John Wiegerink, Ruurlo (NL)

(73) Assignees: BERKIN B.V., Ruurlo (NL); UNIVERSITEIT TWENTE, Enschede (NL); STICHTING VOOR DE TECHNISCHE WETENSCHAPPEN, Utrecht (NL)

( * ) Notice: Subject to any disclaimer, the term of this patent is extended or adjusted under 35 U.S.C. 154(b) by 402 days.

(21) Appl. No.: 16/647,252

(22) PCT Filed: Sep. 17, 2018

(86) PCT No.: PCT/NL2018/050610
§ 371 (c)(1),
(2) Date: Mar. 13, 2020

(87) PCT Pub. No.: WO2019/054873
PCT Pub. Date: Mar. 21, 2019

(65) Prior Publication Data
US 2020/0216308 A1 Jul. 9, 2020

(30) Foreign Application Priority Data
Sep. 15, 2017 (NL) ...................... 2019560

(51) Int. Cl.
*B81C 1/00* (2006.01)

(52) U.S. Cl.
CPC ...... *B81C 1/00071* (2013.01); *B81C 1/00119* (2013.01); *B81B 2201/0242* (2013.01);
(Continued)

(58) Field of Classification Search
CPC ........ B81C 1/00071; B81C 2201/0132; B81B 2201/058; B81B 2203/0338
See application file for complete search history.

(56) References Cited

U.S. PATENT DOCUMENTS

| 6,180,536 B1 * | 1/2001 | Chong ................ B81C 1/00587 438/712 |
| 2005/0098840 A1 * | 5/2005 | Fuertsch ................ B81B 3/007 438/48 |

(Continued)

OTHER PUBLICATIONS

Wikipedia "Chemically Inert" via https://en.wikipedia.org/wiki/Chemically_inert; pp. 1-2 (Year: 2020).*

(Continued)

*Primary Examiner* — Binh X Tran
(74) *Attorney, Agent, or Firm* — Casimir Jones, S.C.; Tanya A. Arenson

(57) ABSTRACT

The invention relates to a method of fabricating a micro machined channel, comprising the steps of providing a substrate of a first material and having a buried layer of a different material therein, and forming at least two trenches in said substrate by removing at least part of said substrate. Said trenches are provided at a distance from each other and at least partly extend substantially parallel to each other, as well as towards said buried layer. The method comprises the step of forming at least two filled trenches by providing a second material different from said first material and filling said at least two trenches with at least said second material; forming an elongated cavity in between said filled trenches by removing at least part of said substrate extending (Continued)

Figure 1:
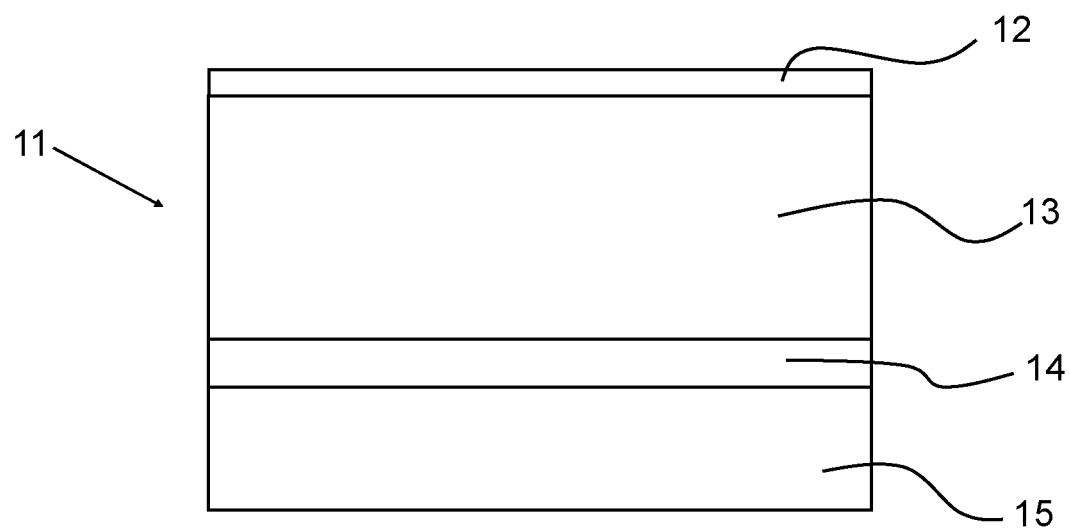

between said filled trenches; and forming an enclosed channel by providing a layer of material in said cavity and enclosing said cavity.

17 Claims, 5 Drawing Sheets

(52) U.S. Cl.
CPC . *B81B 2201/0292* (2013.01); *B81B 2201/058* (2013.01); *B81B 2203/0338* (2013.01); *B81C 2201/014* (2013.01); *B81C 2201/0112* (2013.01); *B81C 2201/0132* (2013.01)

(56) References Cited

U.S. PATENT DOCUMENTS

2007/0202628 A1* 8/2007 Wuertz ............... G01L 9/0054
438/53
2013/0334620 A1* 12/2013 Chu ................... B81C 1/00238
438/51
2014/0264657 A1* 9/2014 Gogoi ..................... B81B 7/02
257/415

OTHER PUBLICATIONS

Jurgen Troe, "Atom and Radical Recombination Reactions", Annu. Rev. Phys. Chem. 1978, 29: pp. 223-250 (Year: 1978).*
Chen et al. "Monolithic High-Aspect-Ratio Embedded Parylene Channel Technology: Fabrication, Integration, and Applications." 1284-1287. 2006 1st IEEE International Conference on Nano/Micro Engineered and Molecular Systems. IEEE, 2006.

* cited by examiner

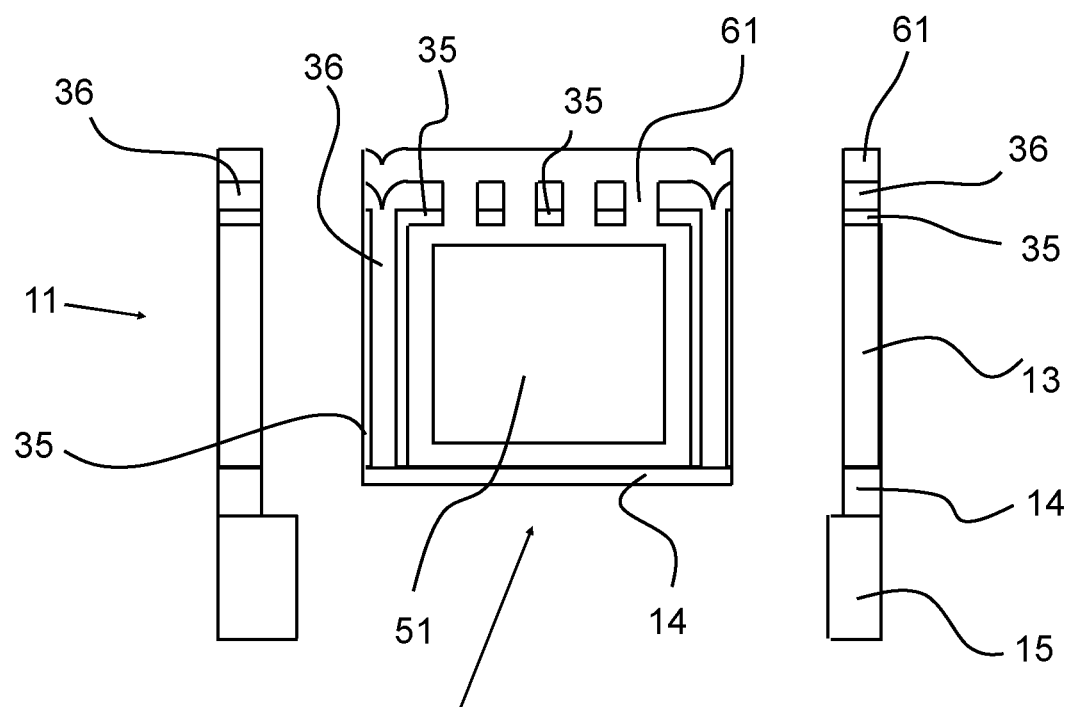

METHOD OF FABRICATING A MICRO MACHINED CHANNEL

CROSS REFERENCE TO RELATED APPLICATIONS

The present application is a 371 U.S. National Phase Entry of pending International Application No. PCT/NL2018/050610, filed Sep. 17, 2018, which claims priority to NL2019560, filed Sep. 15, 2017, each of which are herein incorporated by reference in their entireties.

The present invention generally relates to micromachining processes and devices formed thereby. More particularly, this invention relates to a process of forming a micro machined channel or tube (in general referred to as micro channel) suitable for a microfluidic device, including but not limited to Coriolis mass flow sensors, density sensors, specific gravity sensors, combustion devices, fuel cell concentration meters, chemical concentration sensors, temperature sensors, drug infusion devices, fluid delivery devices, gas delivery devices, gas sensors, bio sensors, medical sensors, and other devices capable of making use of a stationary or resonating microchannel.

Processes for fabricating resonant mass flow and density sensors using silicon micromachining techniques are generally known. As used herein, micromachining is a technique for forming very small elements by bulk etching a substrate (e.g., a silicon wafer), and/or by surface thin-film etching, the latter of which generally involves depositing a thin film (e.g., polysilicon or metal) on a sacrificial layer (e.g., oxide layer) on a substrate surface and then selectively removing portions of the sacrificial layer to free the deposited thin film. Micromachining may include wafer bonding and etching techniques that may be used to produce a micro machined tube supported above a surface of a substrate.

In EP2078936 a method of manufacturing a system chip for a flowmeter is disclosed, wherein a monocrystalline silicon substrate is provided in which a SiN tube is realized by means of SiN deposition steps and partially etching out and partially exposing by etching, such that a tube structure is realized that is fixed at at least one side and is otherwise free, for which a micro surface channel technology (SCT) is used. The channel width and depth are determined by the slits location and quantity. The resulted channel cross-section has a shape of a partial circular channel with a flat top. A limited maximum channel diameter of around 300 µm can be achieved by this SCT. In SCT, silicon etching time through the slits and the location of the slits array are crucial to determine surface channel's shape and size.

It is an object of the invention to provide an improved method of fabricating a micro machined channel, with which in particular improved channels are obtainable.

According to the invention, a method of fabricating a micro machined channel is provided, comprising the steps of:

Providing a substrate of a first material and having a buried layer of a different material therein;
Forming at least two trenches in said substrate by removing at least part of said substrate, wherein said trenches are provided at a distance from each other and wherein said trenches at least partly extend substantially parallel to each other, wherein said trenches extend towards said buried layer;
Forming at least two filled trenches by providing a second material different from said first material and filling said at least two trenches with at least said second material, in particular such that said filled trenches extend up to, and are substantially connected to, said buried layer;
Forming an elongated cavity in between said filled trenches by removing part of said substrate extending between said filled trenches;
Forming an enclosed channel by providing a layer of material in said cavity and enclosing said cavity.

According to the invention as defined in claim 1 a trench-assisted surface channel technology (TASCT) is used for fabricating trench-isolated microchannels. The method according to the invention allows to create high-precision well-defined large-volume channels having substantially rectangular cross-sections in a substrate, such as a Silicon on Insulator (SOI) substrate, which was not possible with methods according to the prior art. The trench structures, in combination with for example a SOI substrate, can be used to define the outline of the channels (channel walls) and they can be used to fabricate pillar-like structures that function as mechanically reinforcing structures. The combination of these two structures enable in-plane channel formation. The TASCT process according to an embodiment of the invention allows the fabrication of free-hanging, mechanical stable and thermally isolated channels. Additionally, walls may be provided with sidewall heating that are beneficial in the formation of large combustion reaction chambers.

In the method according to the invention, the use of trenches introduce the freedom to design channels with any planar shapes and sizes. The fabricated channels may have a substantially rectangular cross-section. The height of the channel side walls may be defined by the device layer thickness of the SOI wafer. The width of the channel can be defined by the trenches mask design. The trenches in the method according to the invention may be used as a wall or pillar to mechanically support large membranes. Additionally, or alternatively, the trenches may be used to function as channel side walls and define the channel shape and size.

Thus, from the above it follows that an improved method for the formation of an improved micro machined channel is obtained, with which the object of the invention is achieved.

Advantageous embodiments of the method will be described below.

In an embodiment, after said step of forming an elongated cavity, said cavity is at least partly bound by said filled trenches. This means that the second material that is used to fill the trenches partly bounds the elongated cavity once material of said substrate of said first material is removed. Thus, the step of removing material for forming an elongated cavity may be a material specific step, i.e. a step that does remove said first material of said substrate but not said second material of said trench. Thus in effect the trenches may be used to define the interior limits of the channel to be formed.

In a further embodiment, after said step of forming an elongated cavity, said cavity is at least partly bound by said buried layer. Thus, the step of removing material for forming an elongated cavity may be a material specific step, i.e. a step that does remove said first material of said substrate but not said material of said buried layer. Thus in effect said buried layer may be used to define the lower limits of the channel to be formed.

Thus it follows that in an embodiment both the trenches and the buried layer may bound said cavity after removing material of the substrate.

In an embodiment said method comprises the step of defining an exterior of said channel by removing at least part of said substrate. This step is beneficial for creating free standing channels or tubes, such as those used in a Coriolis flow sensor. Since the second material is different from the first material, said removing step may be a material-specific step as described above. Thus in effect the trenches may also be used to define the exterior limits of the channel to be formed.

In an embodiment said removing of said first material comprises a release etching step, such as gas phase or vapor phase etching, RIE, DRIE, BOSCH DRIE and/or combinations thereof.

In an embodiment said substrate comprises a silicon on insulator (SOI) wafer.

In an embodiment said substrate comprises a device layer, a buried oxide (BOX) layer and a handle layer. In an embodiment, the Silicon On Insulator substrate comprises a device layer having a thickness of approximately 50 µm, a BOX layer having a thickness of approximately 200 nm and a handle layer having a thickness of approximately 400 µm.

The micro machined channel is in an embodiment at least partly provided in the device layer of the substrate. A wall of the combustion tube may be bound or formed by at least part of the buried layer, in particular the BOX layer. The filled trenches may form a reinforcing supporting structure, being at least partially made from a material that is different from the device layer material to create a mechanical stable channel.

In an embodiment said step of forming at least two trenches comprises etching said two trenches. Said etching may comprise a BOSCH DRIE etching step.

Said step of forming at least two filled trenches may comprise a low pressure chemical vapor deposition (LPCVD) step.

Said second material comprises, in an embodiment, a silicon, such as polycrystalline silicon or Silicon Nitride. Thus, the material used for filling the trenches is a silicon, in particular polycrystalline silicon. Alternatively, monocrystalline silicon material can also be used.

In an embodiment, said step of forming an elongated cavity comprises etching said elongated cavity, in particular isotropic etching of said substrate.

Said step of forming an enclosed channel may comprise a low pressure chemical vapor deposition step.

In an embodiment, in forming said enclosed channel by providing a layer of material, which may be a third material, wherein said layer of material comprises low-stress silicon rich silicon nitride. Thus, the step of forming an enclosed channel comprises the deposition of low stress silicon rich nitride. In this embodiment, the interior of the channel is formed, at least partially, by the low stress silicon rich nitride.

In an embodiment, the method further comprises a masking step for creating a mask. Said mask may be beneficial in one or more of the steps as described above. The masking may include the formation of a hard mask on the substrate, for example by using wet thermal oxidation of the substrate. The hard mask may be patterned, for example by means of an etching step such as RIE. The method may comprise the complete or partial removal of a mask that was provided earlier, for example complete removal of the hard mask by means of HF containing etchant, such as BHF.

Said masking may comprise a patterning step, in that the method comprises the step of patterning said mask. Said patterning may comprises reactive ion etching.

For illustrative purposes, the method may for instance comprise the following five stages:

Etch Stop and Channel Outline

A highly-doped SOI substrate with a device layer of 50 µm, a BOX layer of 200 nm, and a handle layer of 450 µm will be oxidized via wet thermal oxidation at 1150° C. in a suitable furnace. This $SiO_2$ layer will serve as a hard mask during the trench etching. For that, it will be patterned with 3 µm wide trenches via conventional I-line photo-lithography and $SiO_2$ reactive ion etching (RIE) in a suitable plasma etcher. The high aspect ratio trenches of 3 µm wide will be etched completely down to the BOX layer with a notching-free Bosch process with a low frequency (LF) end-step using a suitable deep reactive ion etching (DRIE) plasma system.

Then, a layer of 2 µm parylene-C will be deposited conformally via chemical vapour deposition (CVD) in a suitable system.

This layer will serve as BOX layer protection during subsequent hard mask stripping. The surface parylene-C will be etched back using an $O_2$ plasma in a barrel etcher. Here, we will take advantage of the fact that etching on the surface has a higher rate than etching inside the trenches, i.e. the etch rate is limited by the aspect ratio of the trench.

Subsequently, the $SiO_2$ hard mask will be stripped in buffered HF (7:1 $NH_4F$:HF) and the remaining parylene-C will be stripped away in a piranha solution (3:1 $H_2SO_4$: $H_2O_2$) at °90C.

The trenches will be refilled with low-stress (50 MPa) SiRN via low pressure chemical vapour deposition (LPCVD) in a suitable furnace with a $SiH_2Cl_2/NH_3/N_2$ flow. These refilled trenches will act as etch stops during the channel etch later on.

Channel and Chamber Etch

First, a layer of Cr will be sputtered with a sputter machine on top of the low stress SiRN layer. A slit pattern will be patterned in between two adjacent trenches, which are forming the channel side walls, via I-line photo-lithography and etched with RIE in a suitable etcher. These patterned Cr and SiRN layers will be used as etch mask during the isotropic channel etch, like in the conventional SCT process. The Cr will act as an etch mask during SiRN and Si etch, preventing the increase of the slit width in the SiRN.

The Si inside the microfluidic channels and chamber structures will be etched away through the slits with a suitable etching device. After the channel and chamber etch, the Cr layer will be stripped away in wet Cr etchant.

Channel Wall Formation and Closure

After etching away the Si, the inner channel and chamber walls will be formed via another LPCVD run of low-stress SiRN, which will be conformally grown to a thickness slightly more than half the slit width (total layer thickness: ±1.5 times the slit width). This way, a full closure of all the slits will be ensured, thus completely closing the channel. The use of LPCVD to close the channels is the same as in the conventional SCT process.

Electrical Connects and Metal Deposition

In order to create electrical contacts to the Si side wall heater structures, the two SiRN layers will be patterned via I-line photo-lithography and RIE in a suitable plasma etcher.

Then, the metallic layers (Pt and an adhesion layer), which serve as both the interfacing between the Si side wall heaters and the macro world, and resistive heaters and temperature sensors will be sputtered.

The adhesion between Pt and the substrate can only withstand elevated temperatures of above 500° C. when a proper adhesion layer is used. From previous work it is learned that Ti will not survive elevated temperatures and causes delamination, hole formation and agglomeration of the Pt.

Therefore, an adhesion layer of Ta will be used, which is known to withstand higher temperatures. First, a thin 5 nm Ta layer will be sputtered in a sputter device, directly followed by a 400 nm Pt layer. The metallic layers will be patterned via ion beam etching in an suitable etcher.

Channel Release

As a final step, the channels and chambers will be released in order to create a suspended system, which is thermally isolated from the bulk Si. This release will be done in two steps.

First, a directional etch will be performed with the Bosch process, after which an isotropic etch with will be used to remove the remaining Si in all directions, creating cavities of sufficient size.

Both steps will be performed in a suitable (same) etcher. The hole etched with the Bosch process will reduce the etch time of the isotropic etch, and therefore limits the exposure time of SiRN to $SF_6$.

Figure 2:
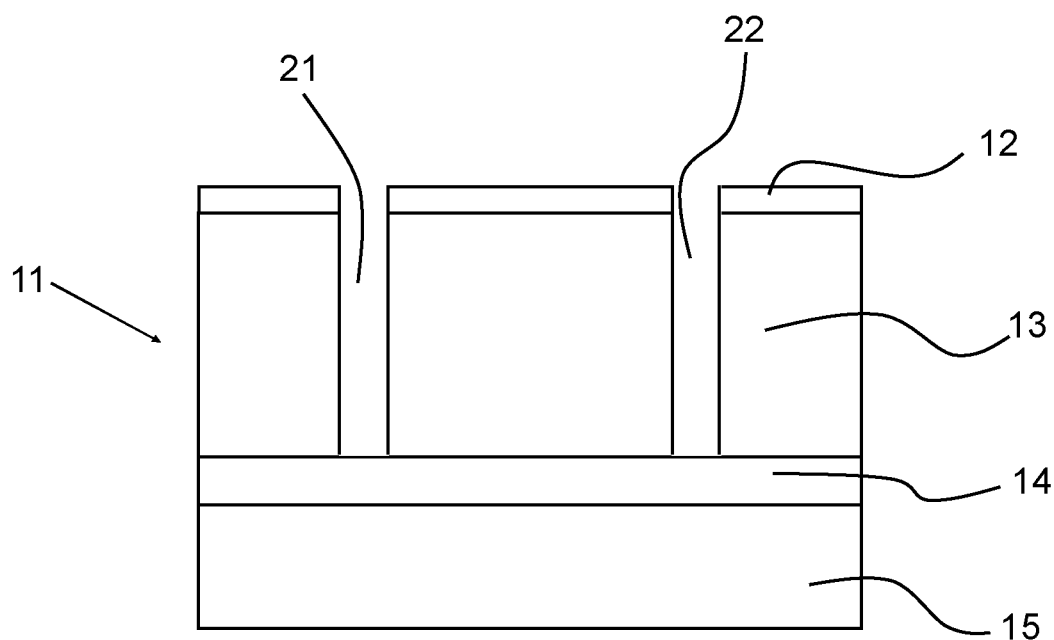
Figure 3:
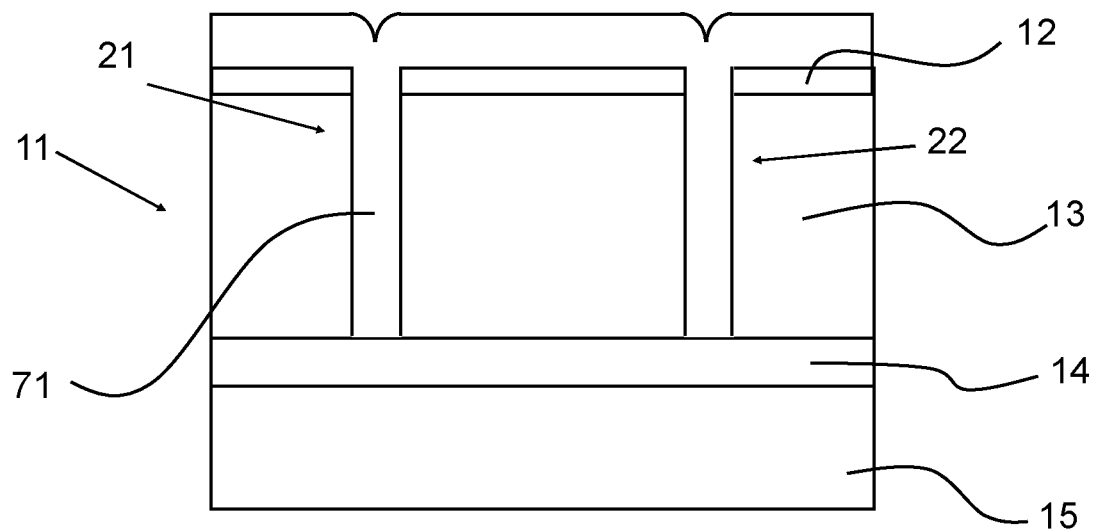
Figure 4:
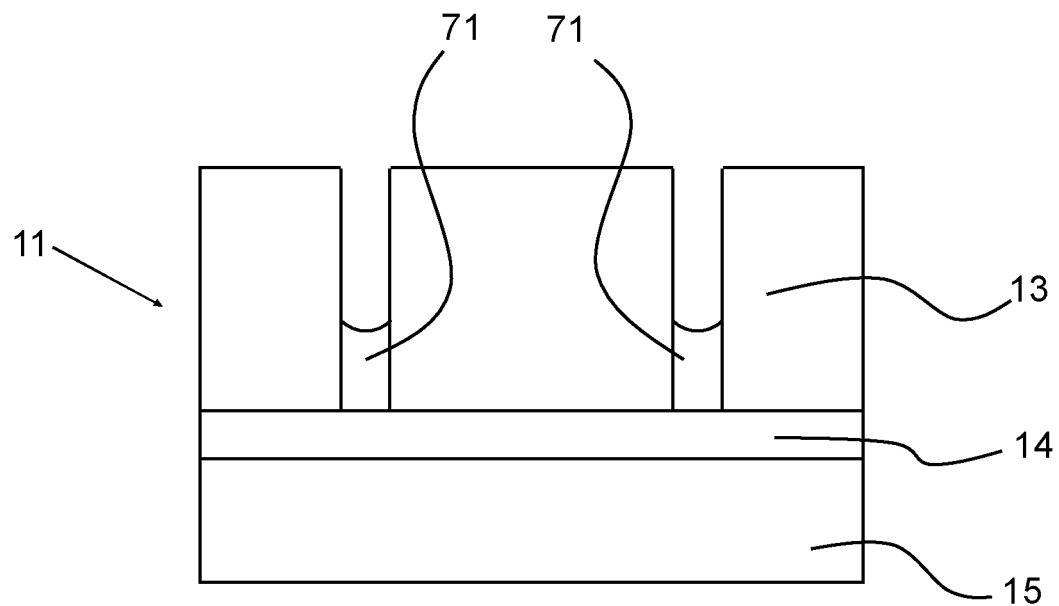
Figure 5:
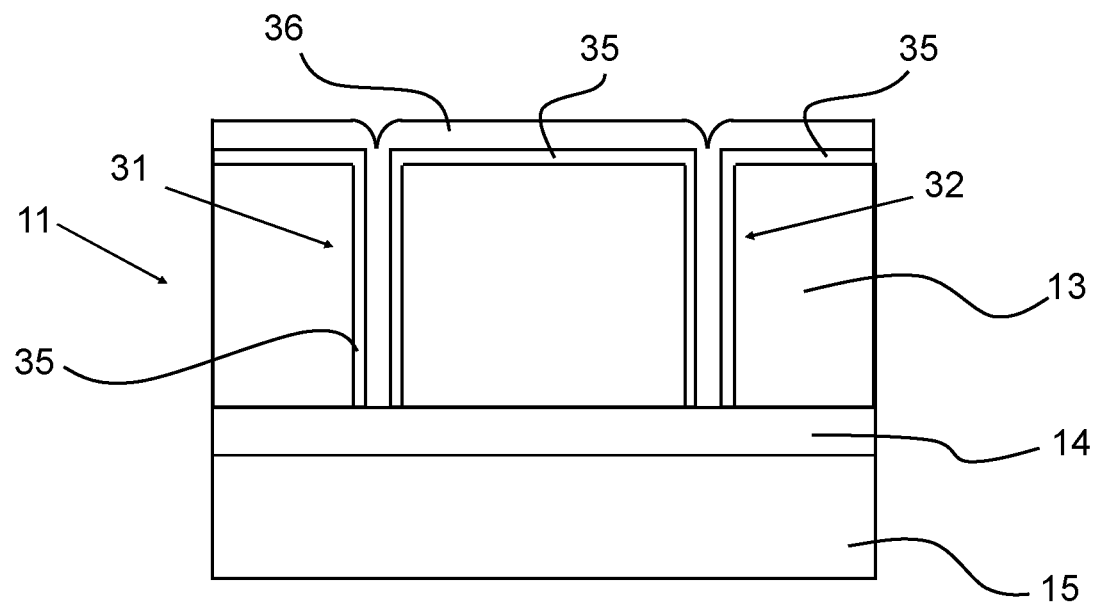
Figure 6:
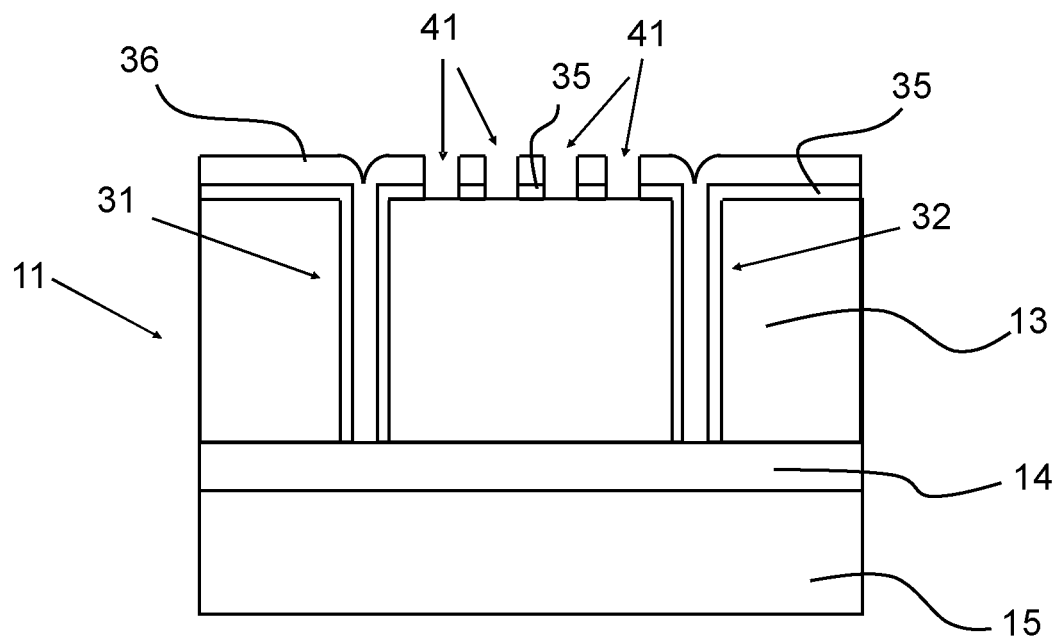
Figure 7:
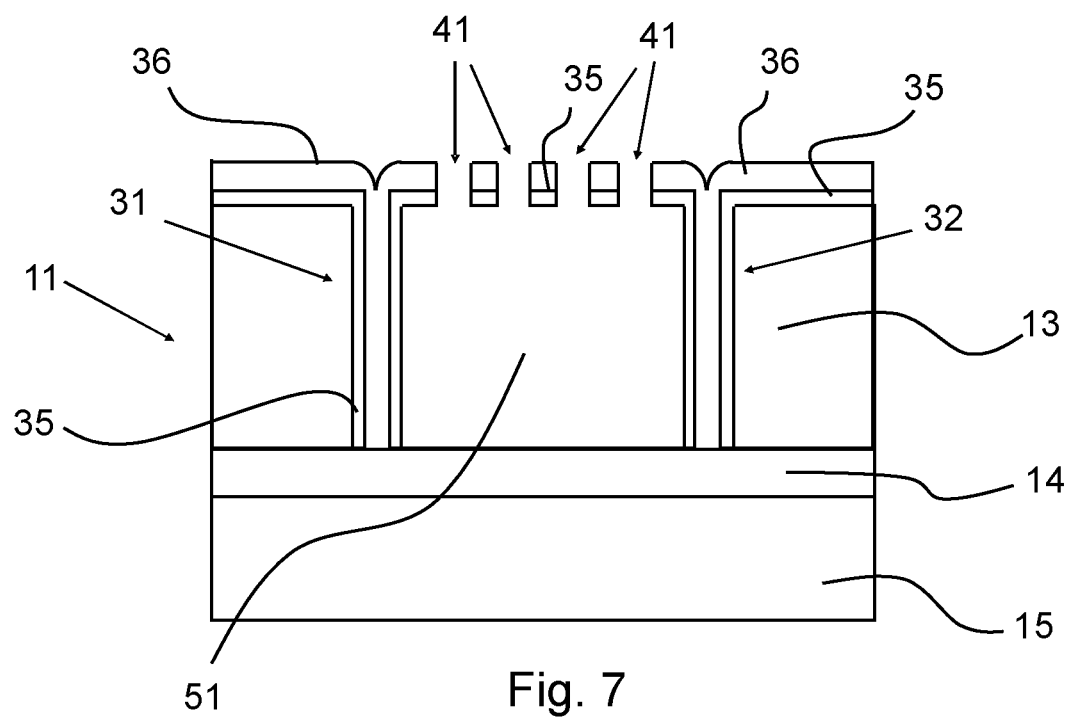
Figure 8:
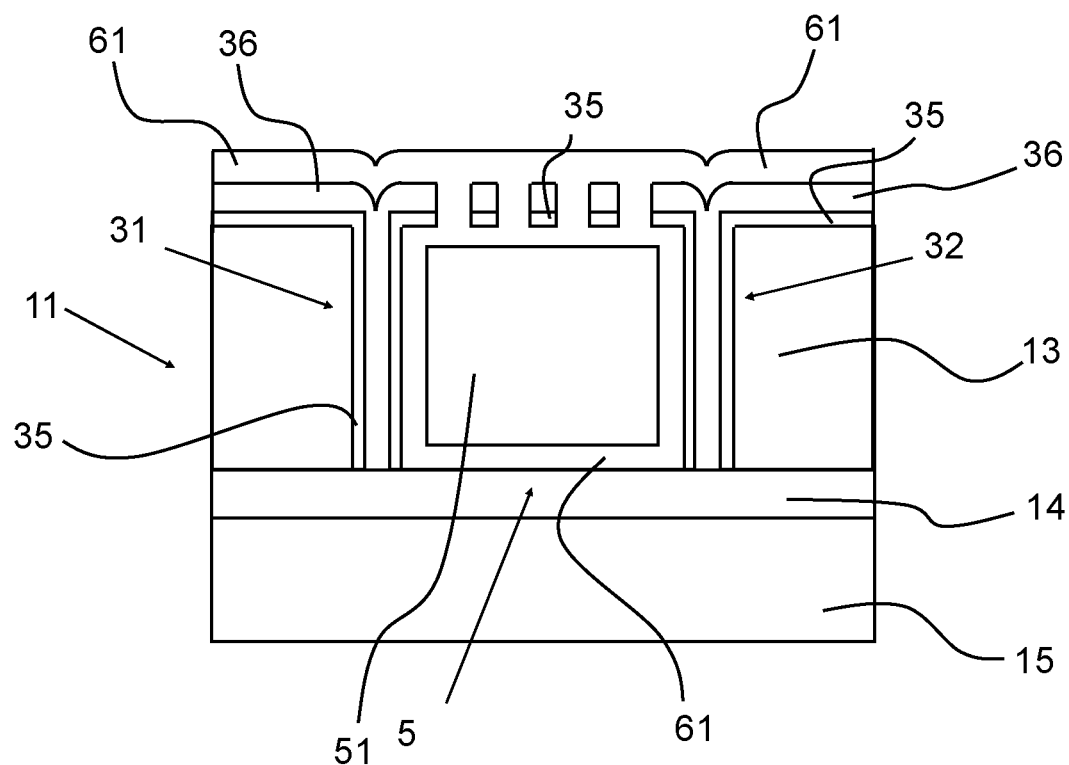

The invention will next be explained by means of the accompanying drawings and description of the figures. In the figures different stages of fabricating a micro machined channel from a substrate are shown, and in particular:

FIG. 1—a schematic cross sectional view of a substrate, such as a Silicon on Insulator wafer, wherein a hard mask is formed using wet thermal oxidation;

FIG. 2—Patterning of the hard mask via RIE, and trench formation via BOSCH DRIE etching;

FIG. 3—BOX protection with parylene-C via CVD;

FIG. 4—Parylene-C etching with $O_2$ plasma and hard mask stripping in BHF;

FIG. 5—Parylene-C stripping in piranha, dry thermal oxidation of SI to create isolation layer, and trench filling with polycrystalline Si via LPCVD;

FIG. 6—Patterning of isotropic etch mask with RIE;

FIG. 7—Isotropic etching of Si to create channels;

FIG. 8—Deposition of low-stress SiRN via LPCVD;

FIG. 9—Release Etching of channels with isotropic etching.

FIGS. 1-9 schematically show an embodiment of the method of fabricating a micro machined channel 101 according to the invention. In general, the method comprises the steps of:

Providing a substrate 11 of a first material (FIG. 1) and having a buried layer 14 therein of a different material;

Forming at least two trenches 21, 22 in said substrate 11 by removing at least part of said substrate 11 (FIG. 2), in particular up to the buried layer 14;

Forming at least two filled trenches 31, 32 by providing a second material different from said first material and filling said at least two trenches 21, 22 with at least said second material (FIG. 5);

Forming an elongated cavity 51 in between said filled trenches 31, 32 by removing part of said substrate 11 extending between said filled trenches 31, 32 (FIG. 7); and Forming an enclosed channel 5 by providing a layer of material 61 in said cavity 51 and enclosing said cavity 51 (FIG. 8).

In an embodiment, said enclosed channel 5 may be partially released from said substrate by defining an exterior of said channel 5 by removing at least part of said substrate 11 (FIG. 9). By removing part of said substrate for defining an exterior of said channel, the fabrication of free-hanging, mechanical stable and thermally isolated channels may be realized.

The process will now be described in more detail.

FIG. 1 shows that an SOI wafer 11 (having for example a 50 µm device layer 13, a 200 nm BOX layer 14, and a 400 µm handle layer 15) is oxidized via wet thermal oxidation (for instance at 1150° C.) for creating a hard mask 12. This $SiO_2$ layer 12 is patterned with 3 µm wide trenches to create the actual mask 12.

FIG. 2 shows that the high aspect ratio trenches 21, 22, which may for example be 3 µm wide, are etched completely down to the BOX layer 14 with a Bosch process using a DRIE plasma system.

Then, referring to FIG. 3, the trenches 21, 22 are filled with a polymer 71, in particular parylene-C, which in the embodiment shown is deposited as a conformal 2 µm thick layer via CVD. The chosen thickness is, in this case, more than half the trench 21, 22 width, ensuring full filling of the trenches 21, 22.

FIG. 4 shows that the surface parylene-C is etched back using an O2 plasma in a barrel etcher. Advantageously, etching on the surface has a higher rate than etching inside the trenches, which means that the $SiO_2$ hard mask 12 is stripped in BHF (7:1 $NH_4F$:HF) whilst protecting the buried (BOX) layer 14. The remaining polymer 71 is stripped away in piranha solution (3:1 $H_2SO_4$:$H_2O_2$), for instance at 90° C.

However, the step of filling the trenches 21, 22 with a polymer 71, in particular parylene-C, can in principle be omitted. Therein, the hard mask 12 is removed and it is accepted that the BOX layer 14 in the trenches 21, 22 is etched.

In the next step, shown in FIG. 5, the trenches are refilled with a multilayer system consisting of a thin $SiO_2$ etch-stop layer 35 grown via dry thermal oxidation and subsequent filling via LPCVD of polycrystalline Si 36. This way, filled trenches 31, 32 are obtained. Of course, other materials such as Silicon Nitride are conceivable as well. In that case, the Silicon Nitride may already function as an etch-stop 5 layer for some etching techniques, meaning that the additional $SiO_2$ 35 layer is not necessary anymore. Thus in effect, the trench may be filled, in an embodiment, with a filling material, which may be a layered material or a single material. The filling material may function as an etch stop layer for specific etching techniques.

Preferably, the polycrystalline Si 36 is then removed from the surface of the wafer 11 by means of isotropic silicon etching to prevent problems when etching the cavity 51.

As shown in FIG. 6 a slit pattern 41, which will be used as isotropic etch mask, is etched between two adjacent trenches 31, 32 with RIE.

Now referring to FIG. 7, it is shown that the Si of the device layer 13 is etched away through the slits 41 with an isotropic gas phase process, stopping on the $SiO_2$ etch-stop 35. This way the cavity 51 is formed.

After etching away the Si 13 for forming the cavity 51, the inner channel wall of the channel 5 is formed via LPCVD of low-stress silicon rich silicon nitride 61, which is conformally grown to a thickness slightly more than half the slit 41 width, ensuring full closure of all slits 41 (see FIG. 8).

As an optional last step, the channels are completely etched free from the top and the bottom, with a suitable etching process, for example an isotropic gas phase etch or semi-isotropic RIE etch.

The TASCT process according to an embodiment of the invention may start with a single SOI wafer and may use $XeF_2$ to etch channel 5 through slits 41 arrays and release channel 5 from the bulk substrate 11, due to XeF$_2$ has fast etch rate and high selectivity for silicon over silicon dioxide. In the depth direction, the Box layer 14 can act as the silicon etch stop through the slits 41, therefore channels 5 are confined in the device layer 13. In the planar direction, high aspect-ratio trenches 21, 22 are etched in the device layer 13, all the trench walls 31, 32 are coated with thin layer of thermal oxide 35 as XeF$_2$ etch stop. Therefore, within the trenches 31, 32 confined device layer 13, through the slits 41 arrays channels 5 can be etched and result with the designed shape and sizes. Outside the trench confined channels, the handle layer 15 and device layer 13 silicon can be etched by XeF$_2$ until reaching the etch stop, which may be the thermal oxide trench walls 35.

In an embodiment, the side walls of the channel 5 formed may be given a heater function. To this end, highly doped device layer silicon 13 is encapsulated/sandwiched within two refilled trenches 31, and these trenches all have thermal oxide coatings 35 and can provide electrical isolation from the bulk silicon substrate 13. In this way, by heating up the channel from the sidewall directions, thermal loss to the environment can be minimized.

The channel 5 top and bottom surfaces may be made from low-stress SiRN membranes, they can be connected by the pillars and sidewalls made from trenches 31, 32 to achieve good mechanical strength. Therefore these thin membranes can be several millimeters long or wide.

The top and bottom membrane thickness may be determined by the width of the rectangular slits 41. Heaters and sensors can be placed on top of the channel ceiling surface to efficiently heat up the channel 5 from the top and sense temperature profile. The bottom membrane may be made very thin and transparent which may be beneficial for observing processes in the micro channel. For example, when used as a combustion channel, the transparency gives good access to microscopic views of flame location in the channel.

The method according to the invention allows for fabricating mechanically stable, thermally isolated microfluidic channels 5 with silicon heaters embedded in the sidewalls, using trench-assisted surface channel technology (TASCT).

Sidewall heating results in highly uniform heating while allowing high heating powers because of the relatively large cross-sectional area (20 μm×50 μm) of the silicon heaters. In demonstrator devices a maximum temperature of 400° C. was reached at a heating power of 1.4 W, limited by mechanical stress.

The method allows a wide range in channel widths and heater thicknesses. The latter allows variation of the power dissipation and thus the temperature profile along the length of the channel.

In most fabrication technologies for suspended microchannels, heating is only possible using heaters on top of the channels 5, resulting in temperature gradients within the cross-section of the channel 5. The method according to the invention allows to incorporate resistive heaters inside the sidewalls of the channels 5, enabling heating from two sides which results in a more uniform temperature profile.

Furthermore, the relatively large cross-sectional area of the heaters allows large heating powers. Important applications are high-temperature physical parameter sensing and (bio)microreactors. In most applications, flow rates up to 1 g h-1 (±0.3 mL s-1) are desired.

Within the method the final shape of the microchannels 5 is independent of the actual channel etch. The outline is defined by using refilled trenches as etch stops. The final channel 5 cross-section is square or rectangular, with a height defined by the used SOI wafer and a width defined by the design. Besides the possibility of sidewall heating, the process also allows in-channel structures like strengthening pillars or mixing-enhancers.

In an exemplary embodiment, straight, 8,500 μm long, channels with sidewall heaters and resistive Pt temperature sensors can be fabricated in a p-type SOI wafer (1e-3-1e-2 Ωcm) via the proposed method. The fabrication may then for instance comprise three stages:

1) Microfluidic channels are fabricated by Bosch etching 50 μm deep trenches in the device layer (DL) and refilling them with a multi-layer system, Bosch etching of inlets in the handle layer (HL), reactive ion etching (RIE) of a slit pattern in the hard mask on the DL, isotropically etching the channels with XeF$_2$, and as final step the formation of the inner wall of the microfluidic structure by low-pressure chemical vapor deposition (LCPVD) of SiRN.

2) Sensor structures and the interfacing of the sidewall heaters are fabricated by first etching openings to the sidewall heaters via RIE, directly followed by sputtering of Ta and Pt and patterning this via ion beam etching. Then, a capping layer of SiN$_x$ is deposited via plasma-enhanced chemical vapor deposition and patterned with RIE.

3) Microchannels are suspended as final step via a multistep approach in which the silicon in the device and handle layers is etched away by XeF$_2$.

The method according to the invention also allows springs and suspensions structures to be made. In a first embodiment, channel structure or solid silicon in the device layer may be used, as they are defined by trenches, therefore any desired shapes such as serpentine springs can be made. Second choice is using a thin membrane of 500 nm thick TEOS, which functions as the slits hard mask, as the spring or suspension by etching all the silicon beneath it by XeF$_2$. In conclusion, with the method according to the invention a lot of freedom in designing the desired shape and size for the flexure and suspension is possible, due to the high selectivity of XeF$_2$ over silicon than silicon dioxide.

In general, many applications for the channel according to the invention are possible. The channels obtainable with the invention may be made with a relatively large cross-sectional area, and with high precision, which is advantageously in terms of fluid dynamics (boundary layer, laminar/turbulent flow, flow development).

One particular application may be the fabrication of a small sized combustion chamber to burn gas blends on chip and measure adiabatic flame temperature. With additional integration of a micro-Coriolis sensor, it is possible to determine the Wobbe Index of any gas blend. In particular when a free-hanging channel is used, thermal heat loss to the environment may be minimized to ensure to be smaller than the heat generated from combustion. In general, a large channel with bigger cross-sectional area may be formed, as this is advantageous to maintain a continuous flame propagation to obtain the adiabatic flame temperature. To overcome the radical quenching, channel inner wall materials may be made chemically inert to avoid radical adsorption and further recombination to cause radical extinction.

To provide thermal isolation, relatively large cavities may furthermore be provided underneath and to the sides of the combustion chamber. The cavity underneath may have a height of for instance up to 400 μm, such as 200-400 μm, for instance 300-400 μm. The cavities to the side may have a width (each) of for instance up to 400 μm, such as 200-400 μm, for instance 300-400 μm.

The invention claimed is:

1. Method of fabricating a micro machined channel, comprising the steps of:
   Providing a substrate of a first material and having a buried layer of a different material therein;
   Forming at least two trenches in said substrate by removing at least part of said substrate, wherein said trenches are provided at a distance from each other and wherein said trenches at least partly extend substantially parallel to each other, wherein said trenches extend towards said buried layer;
   Forming at least two filled trenches by providing a second material different from said first material and filling said at least two trenches with at least said second material;
   Forming an elongated cavity in between said filled trenches by removing at least part of said substrate extending between said filled trenches;
   Forming an enclosed channel by providing a layer of material in said cavity and enclosing said cavity; and
   Providing walls of the channel with sidewall heating.

2. Method according to claim 1, wherein after said step of forming an elongated cavity, said cavity is at least partly bound by said filled trenches.

3. Method according to claim 1, wherein said step of forming at least two trenches comprises etching said two trenches.

4. Method according to claim 1, wherein said step of forming at least two filled trenches comprises a low pressure chemical vapor deposition step.

5. Method according to claim 1, wherein said second material comprises polycrystalline or monocrystalline silicon.

6. Method according to claim 1, wherein said step of forming an enclosed channel comprises a low pressure chemical vapor deposition step.

7. Method according to claim 1, wherein in forming said enclosed channel by providing a layer of material, said layer of material comprises low-stress silicon rich silicon nitride.

8. Method according to claim 1, wherein said method comprises the step of defining an exterior of said channel by removing at least part of said substrate.

9. Method according to claim 8, wherein said removing comprises a release etching step.

10. Method according to claim 1, wherein said substrate comprises a silicon on insulator wafer.

11. Method according to claim 10, wherein said substrate comprises a device layer, a buried oxide (BOX) layer and a handle layer.

12. Method according to claim 1, wherein said step of forming an elongated cavity comprises etching said elongated cavity.

13. Method according to claim 12, wherein said etching comprises isotropic etching of said substrate.

14. Method according to claim 1, further comprising a masking step for creating a mask.

15. Method according to claim 14, wherein said masking comprises wet thermal oxidation of the substrate.

16. Method according to claim 14, comprising the step of patterning said mask.

17. Method according to claim 16, wherein said patterning comprises reactive ion etching.

* * * * *